(12) United States Patent
Gonthier et al.

(10) Patent No.: US 11,271,493 B2
(45) Date of Patent: Mar. 8, 2022

(54) THYRISTOR CONTROL

(71) Applicant: STMicroelectronics LTD, Kowloon (HK)

(72) Inventors: Laurent Gonthier, Taipei (TW); Yu Tsao Lin, Taipei (TW)

(73) Assignee: STMicroelectronics LTD, Kowloon (HK)

( * ) Notice: Subject to any disclaimer, the term of this patent is extended or adjusted under 35 U.S.C. 154(b) by 0 days.

(21) Appl. No.: 16/897,672

(22) Filed: Jun. 10, 2020

(65) Prior Publication Data
US 2020/0395866 A1    Dec. 17, 2020

(30) Foreign Application Priority Data

Jun. 17, 2019 (FR) ..................... 1906487

(51) Int. Cl.
| | | |
|---|---|---|
| H02M 7/162 | (2006.01) | |
| H02M 1/32 | (2007.01) | |
| H02M 1/36 | (2007.01) | |
| H02M 1/42 | (2007.01) | |
| H02M 1/08 | (2006.01) | |
| H02M 1/00 | (2006.01) | |

(52) U.S. Cl.
CPC ......... *H02M 7/1623* (2013.01); *H02M 1/083* (2013.01); *H02M 1/32* (2013.01); *H02M 1/36* (2013.01); *H02M 1/4225* (2013.01); *H02M 1/0085* (2021.05); *H02M 1/322* (2021.05)

(58) Field of Classification Search
CPC ...... H02M 1/0085; H02M 1/083; H02M 1/32; H02M 1/322; H02M 1/36; H02M 1/4225; H02M 7/1623
See application file for complete search history.

(56) References Cited

U.S. PATENT DOCUMENTS

| | | | | |
|---|---|---|---|---|
| 4,161,022 A | * | 7/1979 | Kanazawa | ............ H02M 1/083 219/661 |
| 6,493,245 B1 | * | 12/2002 | Phadke | ............... H02M 1/4225 363/54 |
| 2015/0023073 A1 | * | 1/2015 | Kim | ........................ H02M 1/12 363/52 |

FOREIGN PATENT DOCUMENTS

JP        H04168976 A    6/1992

OTHER PUBLICATIONS

INPI Search Report and Written Opinion for FR 1906487 dated Mar. 4, 2020 (7 pages).

* cited by examiner

*Primary Examiner* — Jue Zhang
(74) *Attorney, Agent, or Firm* — Crowe & Dunlevy (57) ABSTRACT

A rectifying bridge has a thyristor coupled in series with a rectifying element between a first rectified output terminal of a rectifying bridge circuit and a second rectified output terminal of the rectifying bridge circuit. A diode is coupled in series with a DC voltage source between a gate of the thyristor and the second rectified output terminal.

17 Claims, 6 Drawing Sheets

THYRISTOR CONTROL

PRIORITY CLAIM

This application claims the priority benefit of French Application for Patent No. 1906487, filed on Jun. 17, 2019, the content of which is hereby incorporated by reference in its entirety to the maximum extent allowable by law.

TECHNICAL FIELD

The present disclosure generally concerns electronic circuits and more particularly circuits configured to be coupled to an AC voltage source, such as the electric power distribution system. The present disclosure more particularly applies to the control of thyristors of a rectifying bridge of a power converter.

BACKGROUND

Many applications use a power converter, for example, to convert the energy sampled from the electric power distribution system into a voltage usable by electric or electronic circuits. Such converters most often perform a rectification of the AC voltage of the mains, which may be associated with a correction of the power factor before the supply of a DC voltage to a load. The load is often itself a DC/DC or DC/AC conversion circuit of switched-mode power supply type.

Controllable bridges or mixed bridges which enable, once the converter is in steady state, to bypass an inrush current limiting resistor used for the starting are more and more often used.

The presence of switches, typically thyristors, in a rectifying bridge conventionally requires, for the upper half bridge, an auxiliary power supply to control the thyristors. This requires generating an auxiliary power supply voltage in addition to that already necessary to the power factor correction circuit due to the different voltage references. This increases the bulk and the cost of the converter.

There is a need to overcome all or part of the disadvantages of usual mixed bridges or controllable bridges.

SUMMARY

An embodiment provides a circuit comprising: a rectifying bridge having at least one first thyristor in series with a first rectifying element between a first terminal and a second rectified output terminal of the bridge; and at least one diode in series with a DC voltage source between a gate of the thyristor and said second terminal.

According to an embodiment, the circuit further comprises a switch coupled between said output terminals.

An embodiment provides a method of controlling a circuit such as described, comprising a step of turning on the switch at the rate of the halfwaves of the AC voltage.

According to an embodiment, the switch is turned on in the vicinity of the zero crossings of an AC voltage applied to the input of the rectifying bridge.

According to an embodiment, the turning on of the switch is triggered when the AC voltage falls below a value greater than the DC voltage delivered by said source.

According to an embodiment, the turning on of the switch is triggered with a delay with respect to the time when the AC voltage falls below a value greater than the DC voltage delivered by said source.

According to an embodiment, a first resistor couples a cathode of said diode to the gate of said first thyristor.

According to an embodiment, a second thyristor of the rectifying bridge, in series with a second rectifying element between said output terminals, has its gate coupled to said diode via a second resistor.

According to an embodiment, a power factor correction circuit is coupled to said output terminals.

According to an embodiment, a capacitor couples said output terminals of the bridge.

According to an embodiment, an inrush current limiting resistor is capable of being bypassed by said thyristor(s).

According to an embodiment, an AC capacitor couples two input terminals of the rectifying bridge.

According to an embodiment, a discharge circuit capable of discharging the AC capacitor via at least the switch is turned on when a disconnection of the AC voltage is detected.

An embodiment provides a power converter comprising a circuit such as described.

According to an embodiment, the converter further comprises a power factor correction circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the generation of the signals for controlling the power factor correction circuit has not been detailed, the described embodiments being compatible with usual circuits and usual controls of such circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
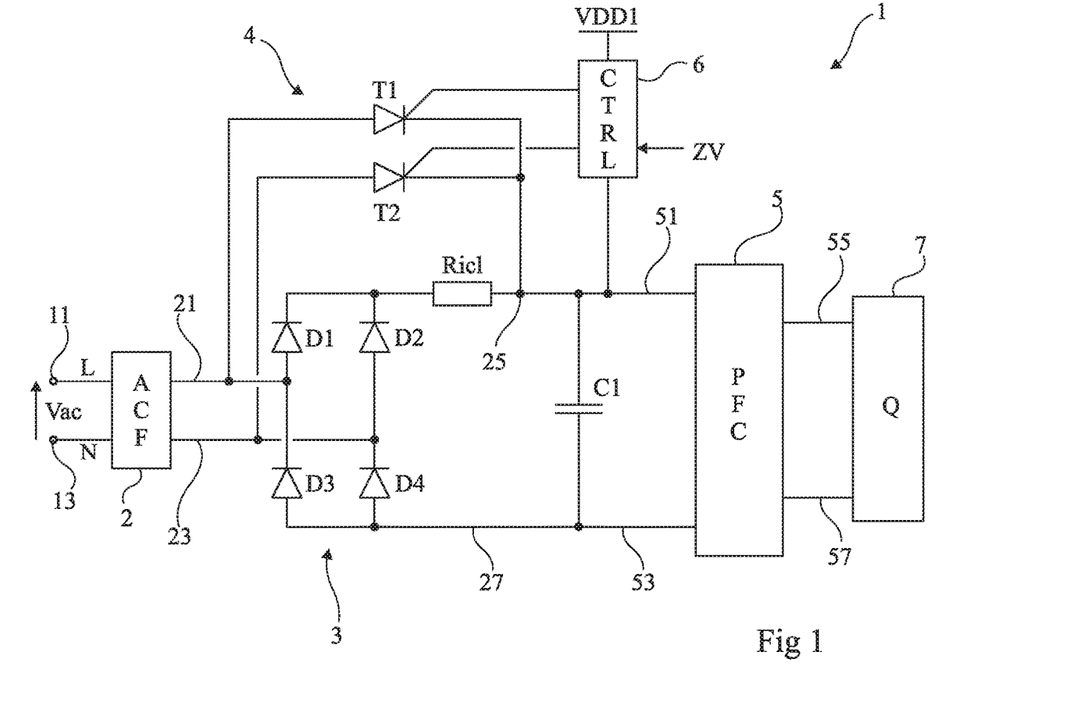
FIG. 1 shows a power converter.

FIG. 1 shows an example of a usual power converter 1.

Such a converter 1 is based on a halfwave or fullwave rectification of an AC power supply voltage Vac, followed by a power factor correction (PFC) to power a load (Q), possibly with a DC/DC or DC/AC conversion.

Schematically, AC voltage Vac is applied between two input terminals 11 (L) and 13 (N) coupled, generally via an AC filter 2 (ACF) or EMI filter, to AC input terminals 21 and 23 of a rectifying bridge 3. Voltage Vac is, for example, the AC voltage or mains voltage of a 230V at 50-Hz or 60-Hz or 110V at 50-Hz or 60-Hz electric power distribution system. Typically, terminals 11 and 13 are formed of pins of a plug of connection of converter 1 to a socket of a power installation.

Rectified output terminals 25 and 27 of the rectifying bridge are coupled to input terminals 51 and 53 of a power factor correction circuit 5 (PFC). Output terminals 55 and 57 deliver a power supply voltage to a load 7 (Q). A capacitor C1 couples, preferably connects, terminals 25 and 27.

In the applications targeted by the present disclosure, converter 1 comprises, in addition to rectifying bridge 3, at least one controllable half bridge 4.

Rectifying bridge 3, which is for example a fullwave rectifying circuit, is formed of four branches coupling two by two each input terminal to each output terminal, a rectifying element (typically a diode) being present in each branch.

Controllable half bridge 4 is a rectifying half bridge where two branches couple the two input terminals 21 to 23 to terminal 51, a switch, typically a thyristor or an SCR, being present in each branch.

Such a half bridge 4 generally equips power conversion systems either as a complement of a non-controllable bridge to bypass an inrush current limiting resistor Ric1, once the system has started.

According to the described embodiments, rectifying bridge 3 is a fullwave bridge associated with a controllable half bridge 4, or a mixed bridge associated with a diode half bridge, which is the same.

In the example of FIG. 1, bridge 3 comprises: two diodes D1 and D2 coupling, preferably connecting, respectively terminals 21 and 23 to a first terminal of resistor Ric1 having its other terminal coupled, preferably connected, to terminal 25, the anodes of diodes D1 and D2 being on the side of terminal 21 and 23; and two diodes D3 and D4 coupling, preferably connecting, respectively terminals 21 and 23 to terminal 27, the anodes of diodes D3 and D4 being on the side of terminal 27. Bridge 4 comprises: two thyristors T1 and T2, here with a cathode gate, coupling, preferably connecting, respectively terminals 21 and 23, to terminal 25, the anodes of the thyristors being on the side of terminals 21 and 23.

At the starting of the circuit, that is, when it is powered up with voltage Vac, thyristors T1 and T2 are not controlled and the rectification of voltage Vac is performed by means of the bridge 3 and resistor Ric1. Once the circuit has started and is in steady state, thyristors T1 and T2 are alternately controlled according to the halfwave of voltage Vac and take on the function of rectifying the upper half bridge. At each halfwave, a single one of the two thyristors (the forward-biased one) is on. The thyristors are controlled with pulses, that is, their gates receive a current pulse at each halfwave of voltage Vac. The term pulse means a signal having a duration shorter than the duration of a halfwave of voltage Vac, preferably by a ratio of at least 10. The use of thyristors enables to bypass resistor Ric1 when the system is in steady state as well as to perform a phase angle control.

Power factor correction circuit 5 usually comprises at least one inductive winding (not shown in FIG. 1) switched at a frequency much higher (with a ratio in the range from 1,000 to 10,000) than the frequency of voltage Vac. As a variation, circuit 5 is a switched-mode power supply circuit.

The presence of thyristors T1 and T2 in the upper portion of the bridge requires being able to generate gate currents with a voltage reference much higher than the reference potential of the converter, that is, the potential (ground) of terminal 27. In particular, the injection of a current into the cathode gates of thyristors T1 and T2 requires for the thyristor cathodes to be at a potential smaller than the potential of their gates G1 and G2. The thyristors are, for example, controlled by a circuit 6 (CTRL) for generating gate currents according to the halfwave of AC voltage Vac. It is then necessary to generate a positive low voltage VDD1 of circuit 6, referenced to terminal 25, in order to power circuit 6. Typically, circuit 6 receives information ZV relative to the zero crossings of the input voltage of the bridge to generate the gate control signals.

The generation of voltage VDD1 requires a transformer (not shown), generally inductive, having a primary winding downstream of terminal 25 and having a secondary winding generating voltage VDD1 referenced to the potential of terminal 25. The need for such a transformer adversely affects the bulk, the cost, and the simplicity of the converter.

Figure 2:
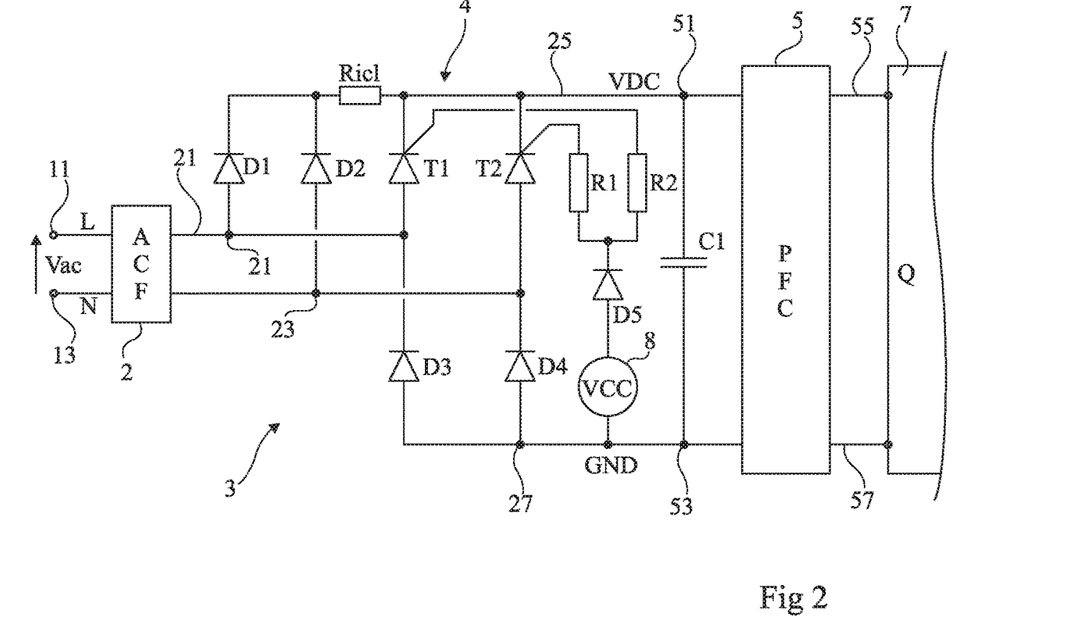
FIG. 2 shows an embodiment of a power converter.

FIG. 2 shows an embodiment of a power converter.

One can find: input terminals 11 and 13 of application of an AC power supply voltage Vac; a rectifying bridge 3, for example, fullwave, having AC input voltages 21 and 23 respectively coupled to terminals 11 and 13; a power factor correction circuit 5 (PFC) or a DC/DC or DC/AC converter having input terminals 51 and 53 coupled, preferably connected, to output terminals 25 and 27 of bridge 3 and having output terminals 55 and 57 powering a load 7 (Q); a controllable upper half bridge 4 coupled between terminals 21 and 23 and positive rectified output terminal 25, half bridge 4, used to short-circuit a diode half bridge D1, D2 of bridge 3, being associated with an inrush current limiting resistor Ric1; optionally, an AC filter 2 between terminals 11 and 13 and terminals 21 and 23; and optionally, a capacitor C1 coupled, preferably connected, to terminals 25 and 27.

In the example of FIG. 2, the diagram takes the form of a mixed bridge having a lower half bridge formed of diodes D3 and D4 and having an upper half bridge formed of thyristors T1 and T2, and of an upper half bridge of diodes D1 and D2 associated with resistor Ric1.

According to this embodiment, the gates of thyristors T1 and T2 are coupled, via respective resistors R1 and R2, to a cathode of a diode D5 having its anode coupled, preferably connected, to a low DC voltage VCC (source 8) referenced to ground 27 (GND). Low voltage means a voltage smaller than 30 volts, for example, in the order of 20 volts, or even less.

The role of this circuit assembly is to cause, for each halfwave of voltage Vac, when the output voltage VDC of the bridge becomes smaller than voltage VCC (to within voltage drops in diode D5 in the on state and in resistors R1 and R2), the flowing of a current from voltage source 8 through diode D5, resistors R1 and R2, the gates of thyristors T1 and T2, and capacitor C1. Capacitor C1 is thus used at each end of a halfwave and beginning of the next one to allow the circulation of the gate currents. The value of voltage VCC conditions a voltage threshold around the zero crossing of the voltage between terminals 51 and 53 during which the currents flow.

Thus, it is no longer necessary to generate a voltage referenced to terminal 25 to control thyristors T1 and T2. Voltage VCC may further be easily generated based on voltage VDC. Indeed, it is not disturbing for this voltage not to be present at the starting of the system since thyristors T1 and T2 need not be controlled to bypass resistor Ric1 once the system is in steady state.

In this simplified embodiment, no control is required and the thyristors are automatically turned on. It is however necessary for the discharge of capacitor C1 to be sufficient, and/or for the load to consume power sufficiently downstream as the voltage comes close to the zero between terminals 11 and 13 (voltage Vac), in order for the system to operate. For a stable consumption load, resistors R1 and R2 and diode D5 just need to be sized in adapted fashion to deliver the gate current necessary to trigger thyristors T1 and T2. However, this embodiment is not the best adapted to a very low variable load, for which capacitor C1, if present in the circuit, would not be sufficiently discharged. This amounts to the case, if capacitor C1 is absent, where the equivalent impedance of circuit 5, seen between terminals 51 and 53, is very high.

Figure 3:
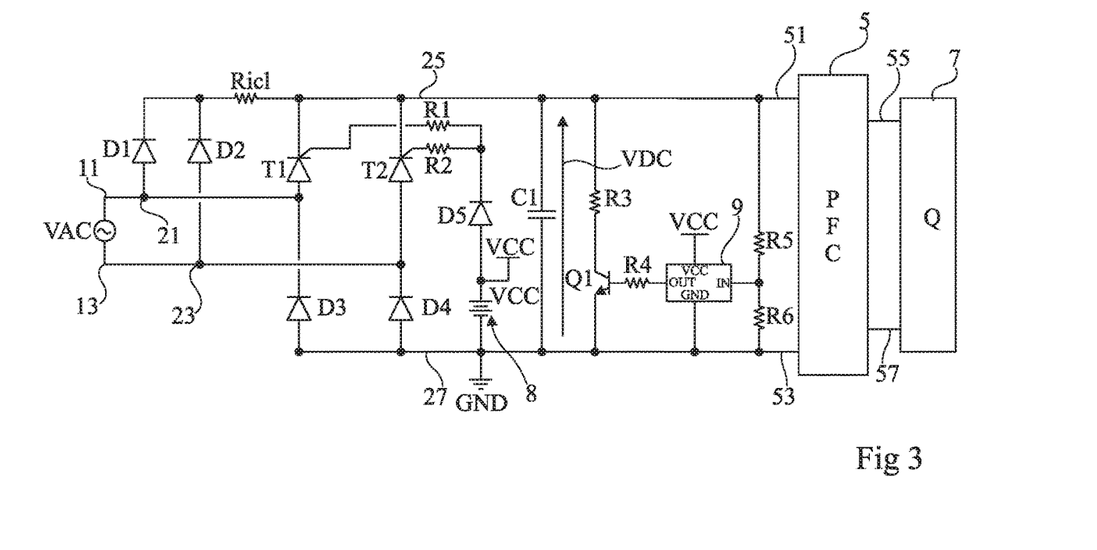
FIG. 3 shows another embodiment of a power converter.

FIG. 3 shows another embodiment of a power converter.

According to this embodiment, the circuit of FIG. 2 is completed with a circuit assembly forcing the discharge of capacitor C1 at each halfwave end to ease the flowing of the gate currents. For a circuit comprising no capacitor C1, this circuit enables to force the conduction of diode D5, to allow the flowing of gate currents through thyristors T1 and T2 in the case where the elements downstream of terminals 51 and 53 have too high of an impedance to generate a conduction of thyristor T1 or T2 at the beginning of the halfwave.

Thus, a transistor Q1, for example, a bipolar transistor, is provided in series with a resistor R3, between terminals 25 and 27. For example, the emitter of an NPN-type bipolar transistor Q1 is coupled, preferably connected, to ground 27. The collector of transistor Q1 is coupled, by resistor R3, to terminal 25. The base or control terminal of transistor Q1 receives a control signal from a circuit 9, for example, via a resistor R4.

Circuit 9 is, preferably, powered with voltage VCC (between terminals VCC and GND) and generates a square pulse for controlling transistor Q1 in the vicinity of (i.e., around) each zero crossing of rectified voltage VDC. For example, an input IN of circuit 9 is coupled, preferably connected, to the junction point of two resistors R5 and R6 coupled, preferably connected, between terminals 25 and 27. The series association forms a voltage dividing bridge enabling to trigger, at the level of circuit 9, a switching of its output OUT between a high level and a low level. When output OUT is in the high level, transistor Q1 is turned on, which forces the discharge of capacitor C1, if present, by dissipation in resistor R3 and forces the current conduction in diode D5, one of resistors R1 and R2, and one of thyristors T1 and T2, be capacitor C1 present or not.

The operation of the circuit assembly depends on the power consumption of the load connected downstream of the converter. Indeed, if the load has a low power consumption, the current in the bridge, and thus also in the thyristor anodes, will become zero before the turn-on gate currents of the thyristors have been sufficient. In this case, resistor Ric1 is not bypassed and dissipates energy at each halfwave. Thus, the described solution is especially advantageous when the load connected downstream of circuit 5 consumes a sufficient current for the currents of thyristors T1 and T2 to reach their turn-off thresholds at each beginning of a halfwave. The notion of sufficient current depends on the application but is, for example, at least 10% of the nominal power of the application.

Figure 4:
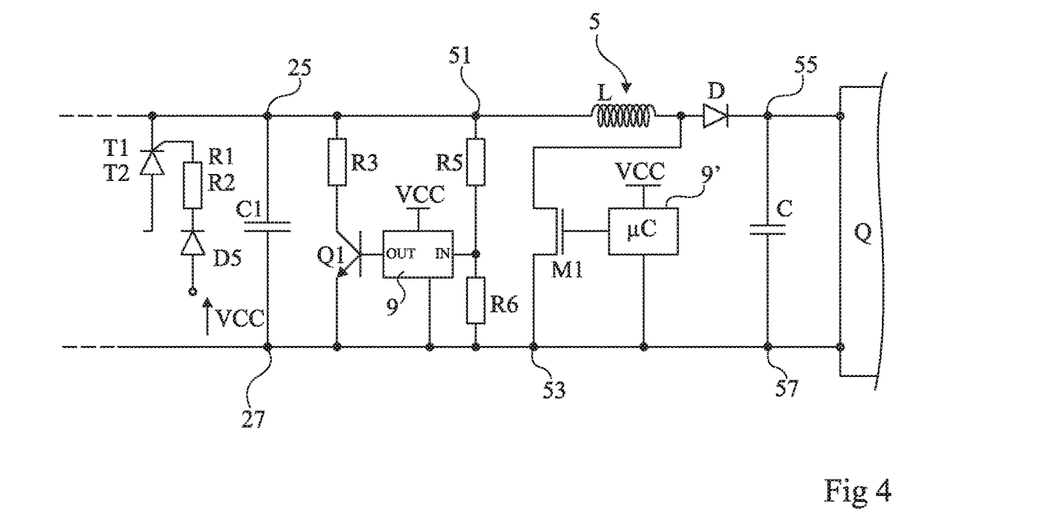
FIG. 4 details a power factor correction circuit of the converter of FIG. 3.

FIG. 4 details an example of a power factor correction circuit of the converter of FIG. 3.

FIG. 4 is a partial representation. In particular, rectifying bridge 3 is not shown and only one branch of half bridge 4 is shown (thyristor T1 or T2), associated with its gate resistor R1 or R2.

Power factor correction circuit 5 comprises, for example: an inductance L in series with a diode D between terminals 51 and 55; a switch M1, for example, a MOS transistor, coupling, preferably connecting, terminal 53 to the junction point of inductance L and of diode D; an output capacitor C coupling, preferably connecting, terminals 55 and 57; and a circuit 9', for example, a microcontroller (μC) for controlling switch M1. Microcontroller 9' is, for example, powered with voltage VCC or with a voltage extracted from voltage VCC.

Switch M1 is controlled at a high frequency with respect to the frequency of voltage Vac, with a ratio of at least 1,000 (for example, at a frequency of a few hundreds of kHz). The operation of power factor correction circuit 5 is usual per se.

FIGS. 5A-5B, 5A-6B, 7A-7B and 8 illustrate, in timing diagrams, the operation of the circuit assembly of FIG. 3 for a plurality of power supply voltages Vac and a plurality of power consumption levels of the load powered by the converter. The drawings take, as an example, unfavorable situations for the turning off of thyristors T1 and T2, that is, a power factor correction circuit operating in discontinuous current mode where the current in inductance L (FIG. 4) becomes zero at each switching period of transistor M1.

The drawings show examples of shapes of the voltage VDC across capacitor C1, of the voltage VQ1 across switch Q1 (illustrating its conduction periods during which it partially discharges capacitor C1), and of the cathode current I in forward-biased thyristor T1 or T2 (transistor T1 during positive halfwaves of voltage Vac and transistor T2 during negative halfwaves of voltage Vac). The discharge of capacitor C1 is performed until current I reaches the turning off of the thyristor which had been turned on.

Figure 5A:
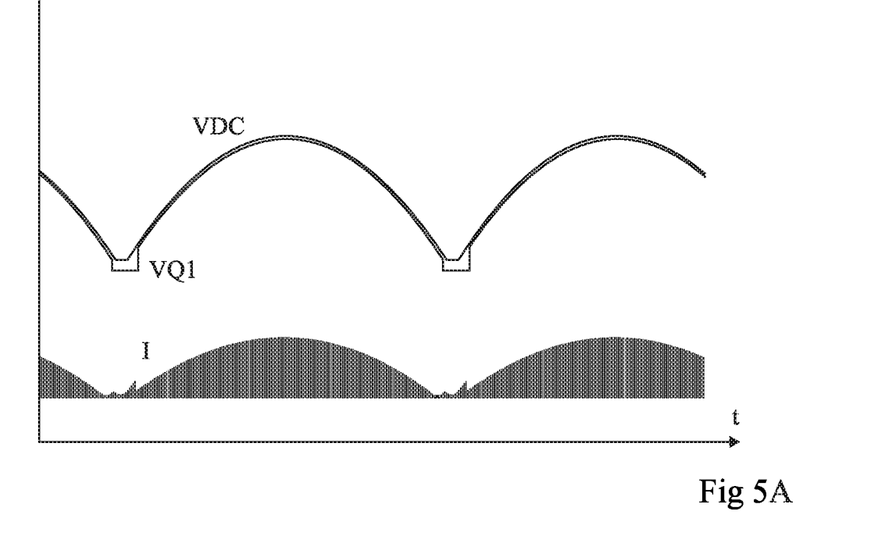
FIGS. 5A-5B illustrate the operation of the converter of FIG. 3 in a power supply and charge condition.
Figure 5B:
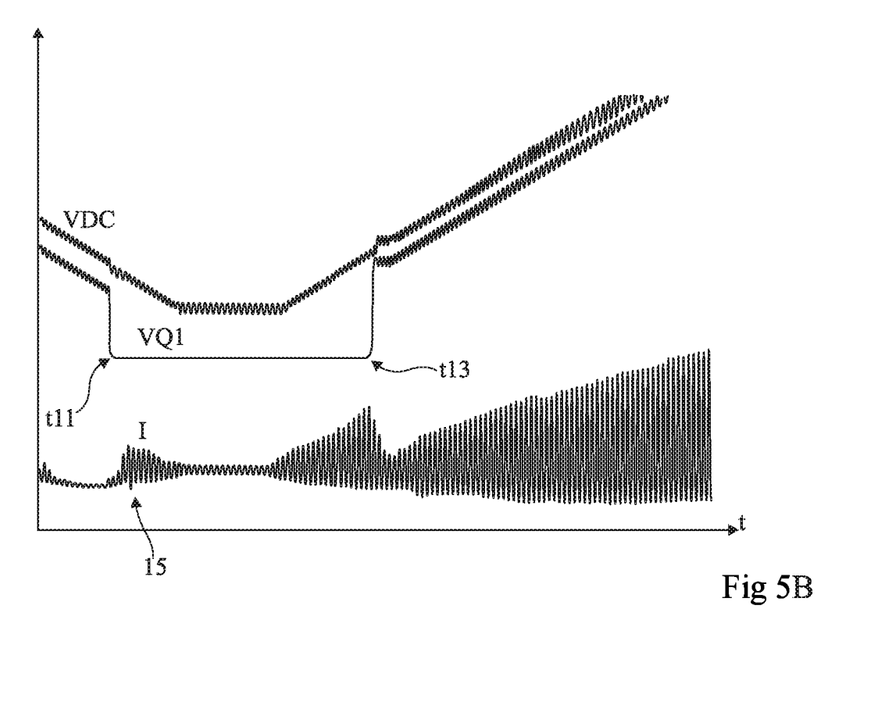

FIGS. 5A-5B illustrate the operation of the converter of FIG. 3 for a 110-volt voltage Vac and a 50-Hz frequency, and a 25% load, that is, load 7 absorbs a power equal to 25% of the nominal power of the converter.

FIG. 5A shows two halfwaves of voltage Vac while FIG. 5B is an enlargement around the zero crossing of voltage VDC.

As illustrated in the timing diagrams, when circuit 9 detects that voltage VDC falls below a threshold conditioned by resistors R5 and R6, for example, below 20 volts, transistor Q1 is turned on (time t11, FIG. 5B). Capacitor C1 discharges and is maintained at least at the level of voltage VCC by the circulation from source 8. At the beginning of the next halfwave, the gate current becomes sufficient to turn on thyristor T1 or T2 and cathode current I reaches the turn-off threshold of thyristor T1 or T2. It should be noted that the current I of the drawing includes the gate current which flows from the gate to the cathode (cathode current I corresponds to the sum of the gate current and of the cathode current). At the turning off of switch Q1 (time t13), thyristor T1 or T2 thus remains on until the end of the halfwave. As illustrated in the left-hand portion of FIG. 5B, no current flows through thyristors T1 or T2 at the end of a halfwave. This is due to the fact that the load requires no energy during the entire power supply period. One of the thyristors is however turned on at the very end of a halfwave (area identified by arrow 15) and then turns off when capacitor C1 is discharged to level VCC.

Figure 6A:
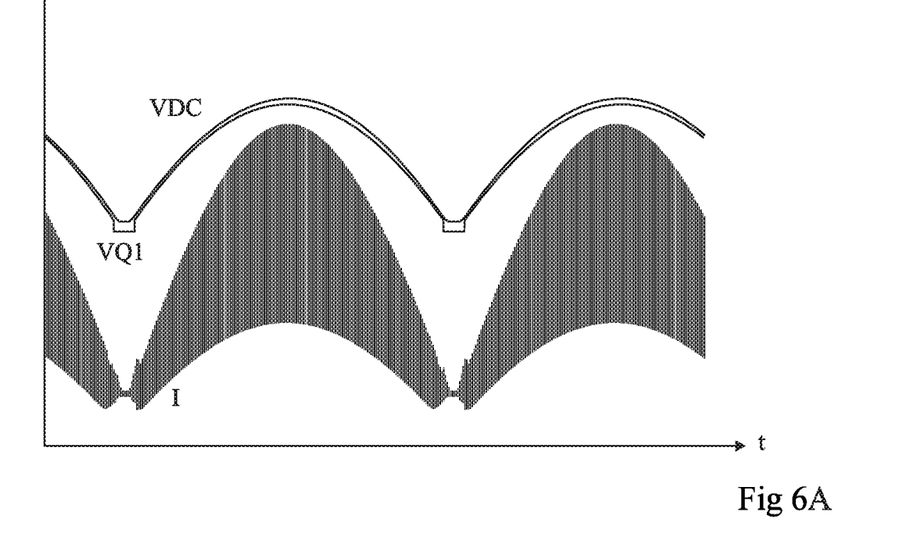
FIGS. 6A-6B illustrate the operation of the converter of FIG. 3 in another power supply and charge condition.
Figure 6B:
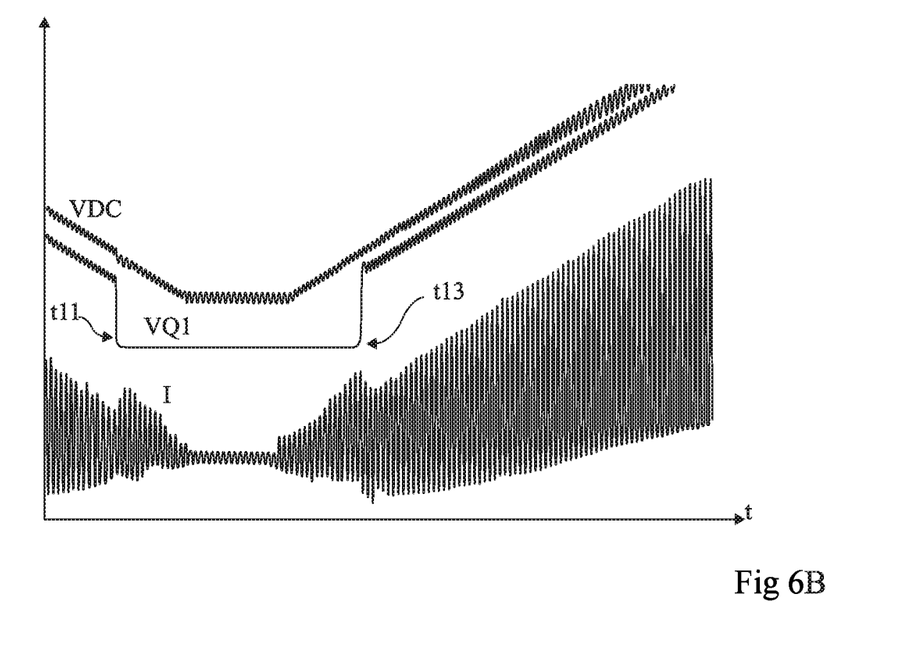

FIGS. 6A-6B illustrate the operation of the converter of FIG. 3 for a 110-volt voltage Vac and a 50-Hz frequency, and a 100% load, that is, the load absorbs a power equal to the nominal value of the converter.

FIG. 6A shows two halfwaves of voltage Vac while FIG. 6B is an enlargement around the zero crossing of voltage VDC.

As compared with the situation of FIGS. 6A-6B, since the load here permanently consumes power, the thyristor T1 or T2 which has been turned on at the beginning of a halfwave remains on until the end of the halfwave (left-hand portion of FIG. 6B).

Figure 7A:
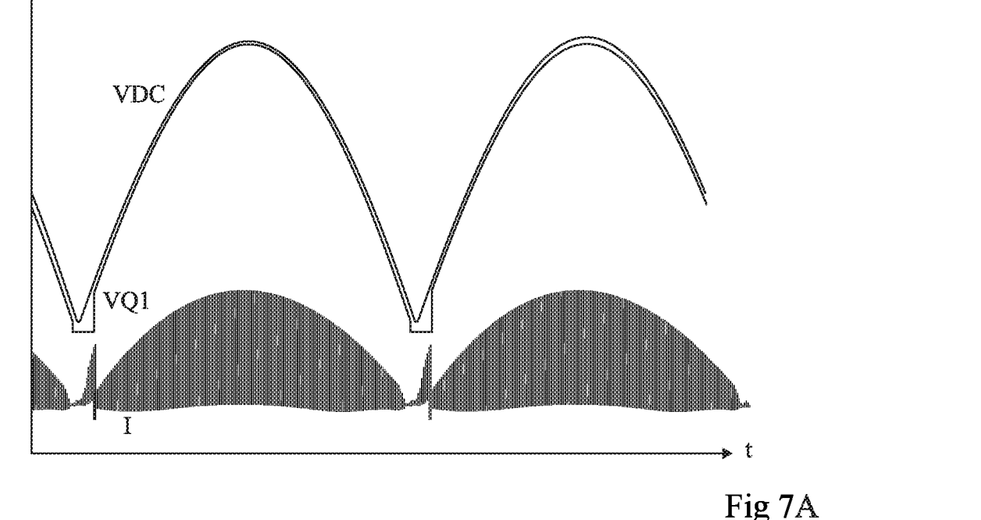
FIGS. 7A-7B illustrate the operation of the converter of FIG. 3 in another power supply and charge condition.
Figure 7B:
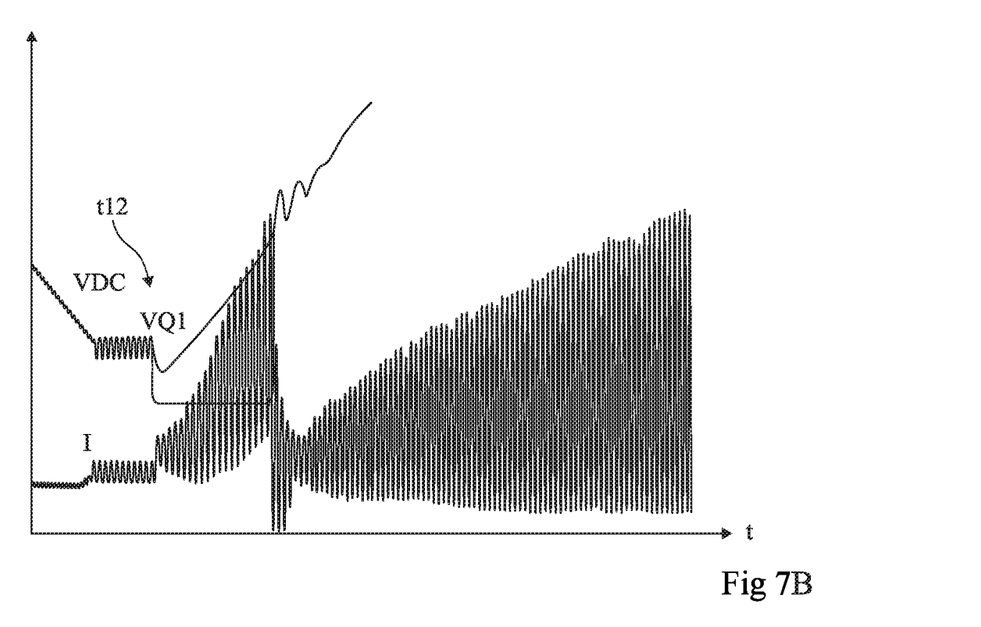

FIGS. 7A-7B illustrate the operation of the converter of FIG. 3 for a 230-volt voltage Vac and a 50-Hz frequency, and a 50% load, that is, the load absorbs a power equal to 50% of the nominal value of the converter.

FIG. 7A shows two halfwaves of voltage Vac while FIG. 7B is an enlargement around the zero crossing of voltage VDC.

In such a situation, transistor Q1 is not turned on at the end of a halfwave but is only turned on at the beginning of the next halfwave (time t12), to only control transistor Q1 at the right time, that is, when voltage Vac starts increasing back, which also enables the cathode current to reach the turn-off threshold faster, as compared with the initial time of beginning of the conduction of transistor Q1. Such a delay in the turning on of transistor Q1 enables to decrease its conduction time to the useful fraction (the duration between time t11 and the time when VDC becomes greater than plateau VCC is indeed useless) and thus to decrease the power dissipation in resistor R3.

Figure 8:
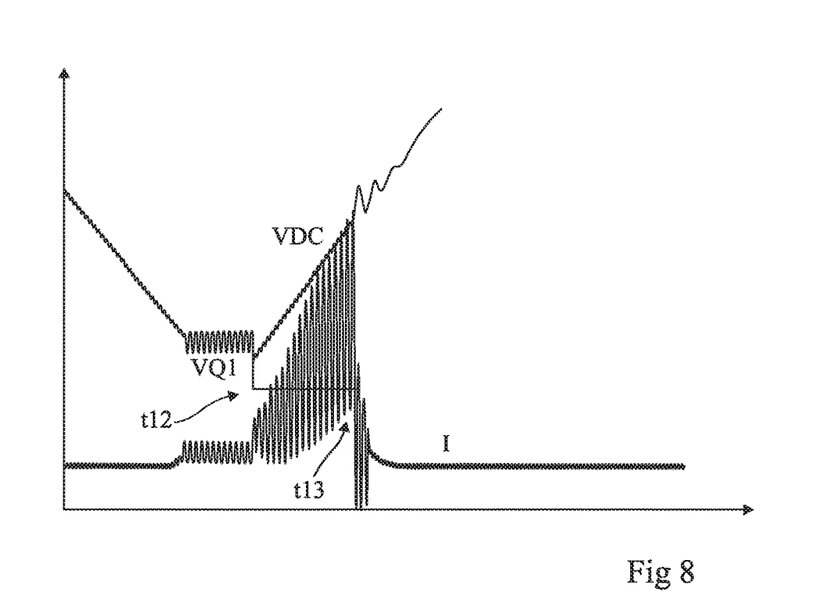
FIG. 8 illustrates the operation of the converter of FIG. 3 in another power supply and charge condition.

FIG. 8 illustrates the operation of the converter of FIG. 3 for a 230-volt voltage Vac and a 50-Hz frequency, and a 25% load, that is, load Q absorbs a power equal to 25% of the nominal value of the converter.

The representation of FIG. 8 is an enlargement around the zero crossing of voltage VDC.

Such a situation is an extreme situation where, although the discharge of capacitor C1 forced by transistor Q1 between times t12 and t13 allows the generation of a gate current and the turning on of one of the thyristors, the low power consumption of the load generates a decrease in current I below the turn-off threshold of the thyristor and, accordingly, the turning off of the thyristor when the gate current becomes zero and this, until the end of the halfwave. Resistor Ric1 then ensures the continuity of the current supply from voltage Vac to the converter.

Figure 9:
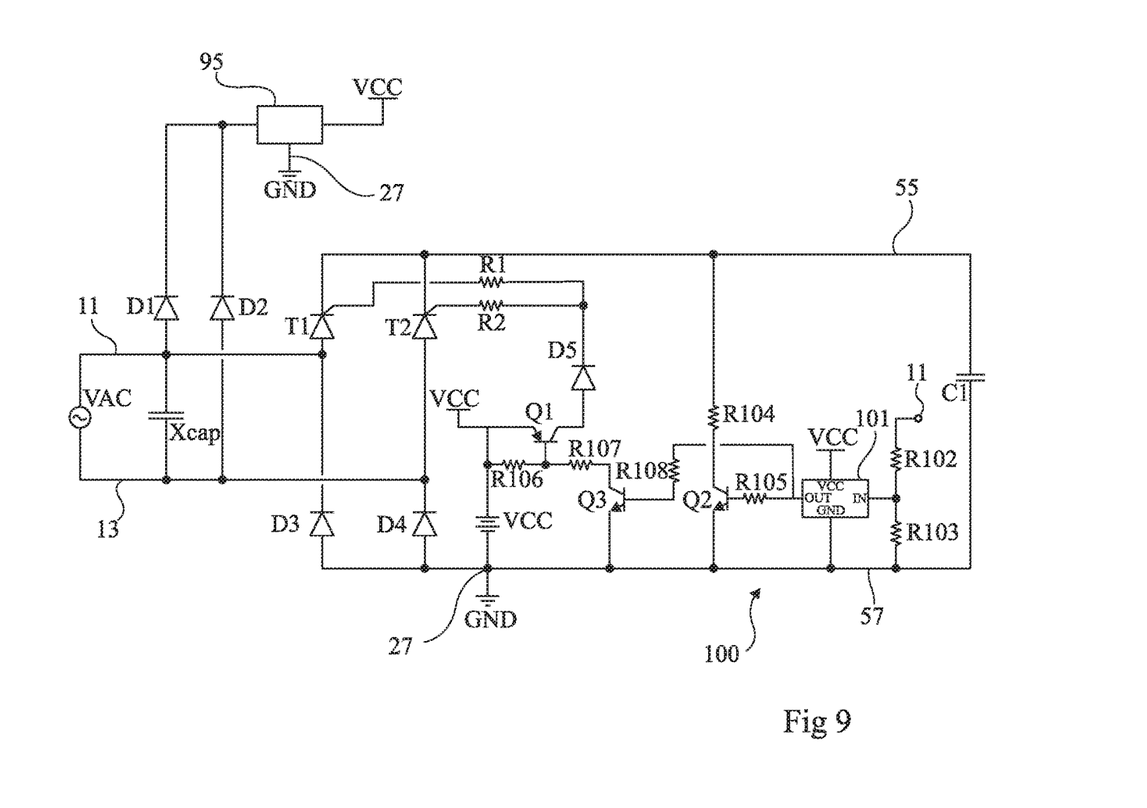
FIG. 9 shows a variant of the power converter of FIG. 3.

FIG. 9 shows a variant of a converter.

According to this variant: an AC capacitor Xcap couples, preferably connects, terminals 11 and 13 and forms the AC filter; transistor Q1 is controlled from a circuit assembly enabling to provide the delay of its control pulse applied to provide the operation described in FIG. 7; and resistor Ric1 is suppressed (i.e., eliminated from the circuit).

Voltage VCC, which cannot be supplied at the start by resistor Ric1 is then delivered by an auxiliary converter 95, preferably insulated, having an input terminal coupled, preferably connected, to the common cathode of diodes D1 and D2, and having an output terminal delivering voltage VCC, where converter 95 is self-powered from the voltage VCC that it generates.

Once voltage VCC is generated, thyristors T1 and T2 are controlled with a turn-on delay (with a progressively decreased delay) to ensure the progressive charge of capacitor C1 (if present) and of the other capacitors located downstream of the power factor correction circuit (for example, capacitor C, FIG. 4).

Such a control is ensured by a circuit assembly 100 which comprises: a circuit 101 for detecting the zero crossing of voltage Vac, having an input terminal IN coupled to the midpoint of a resistive dividing bridge formed of resistors R102 and R103 in series between terminal 11 (or terminal 13, or both via a rectifier) and ground 27, circuit 101 being powered with voltage VCC, between terminals VCC and GND; an NPN-type bipolar transistor Q2, having its collector coupled to terminal 55 by a resistor R104 and having is collector coupled, preferably connected, to ground 27, the base of transistor Q2 being coupled, by a resistor R105, to an output terminal OUT of circuit 101; and an NPN-type bipolar transistor Q3, having its collector coupled, by a resistor R107, to the base of transistor Q1 and having its emitter coupled, preferably connected, to ground 27, the base of transistor Q2 being coupled, by a resistor R108, to the output terminal OUT of circuit 101.

Transistor Q1 here is a PNP transistor having its collector coupled, preferably connected, to the anode of diode D5, having its emitter receiving voltage VCC, and having its base coupled to the junction point of a resistor R106 and of resistor R107 between the collector of transistor Q3 and the terminal for delivering voltage VCC.

Transistor Q1 enables to control thyristors T1 and T2 in the vicinity of (i.e., around) the zero crossing of the mains voltage in steady state or with a delay with respect to the zero crossing time of voltage Vac, detected by circuit 101. The pulses for controlling transistors Q3 (and thus Q1) and Q2 may have a variable duration, during the starting phase, from one halfwave to the other, and a different duration in steady state.

Advantage can then be taken of the presence of switches Q1 and Q2 to, when voltage Vac disappears, discharge capacitor Xcap by continuously turning on switch Q1 and thyristors T1 and T2.

Such a discharge is desirable for electric security reasons.

An advantage of the described embodiments is that their implementation requires no auxiliary power supply other than, for the embodiment of FIG. 3, that already available to power circuit 9' for controlling the power factor correction circuit.

Various embodiments and variants have been described. Those skilled in the art will understand that certain features of these various embodiments and variants may be combined, and other variants will occur to those skilled in the art. In particular, the solution disclosed to control switch Q1 in the vicinity of the zero crossing of voltage VDC is an example only and other solutions, for example, using the microcontroller of the power factor correction circuit, may be provided. Further, although embodiments based on full-wave bridges have been described, these embodiments can be easily transposed to a halfwave rectifying circuit.

Finally, the practical implementation of the embodiments and variants described herein is within the capabilities of those skilled in the art based on the functional description provided hereinabove. In particular, the selection of the duration and of the delay of the square pulse for controlling the turning on of transistor Q1 according to the considered application depends on the application and can be determined from the above disclosure.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A circuit, comprising:
   a rectifying bridge having a first thyristor coupled in series with a first rectifying element between a first rectified output terminal of the rectifying bridge and a second rectified output terminal of the rectifying bridge; and
   a first diode having an anode directly connected to receive a fixed voltage from a DC voltage source referenced to the second rectified output terminal and a cathode coupled to a gate of the first thyristor.

2. The circuit according to claim 1, further comprising a transistor switch having a conduction path extending between said first and second output terminals, wherein said transistor switch is selectively actuated to force current conduction from said DC voltage source through said first diode.

3. The circuit according to claim 1, further comprising a transistor switch having a conduction path extending between said first and second output terminals, wherein said transistor switch is selectively actuated at a rate of halfwaves of an AC voltage applied to inputs of the rectifying bridge.

4. The circuit according to claim 1, further comprising a transistor switch having a conduction path extending between said first and second output terminals, wherein said transistor switch is selectively actuated in the vicinity of the zero crossings of an AC voltage applied to the input of the rectifying bridge.

5. The circuit according to claim 4, wherein a turning on of the transistor switch is triggered when the AC voltage falls below a value greater than a DC voltage delivered by said DC voltage source.

6. The circuit according to claim 4, wherein the turning on of the switch is triggered after a delay following a time when the AC voltage falls below a value greater than a DC voltage delivered by said DC voltage source.

7. The circuit according to claim 1, further comprising a first resistor that directly connects the cathode of said first diode to the gate of said first thyristor.

8. The circuit according to claim 1, further comprising a power factor correction circuit coupled to said first and second output terminals.

9. The circuit according to claim 1, further comprising a capacitor directly connected between the first and second output terminals of the rectifying bridge.

10. The circuit according to claim 9, further comprising a transistor switch having a conduction path extending between said first and second output terminals, wherein said transistor switch is selectively actuated to discharge said capacitor.

11. The circuit according to claim 10, wherein the selective actuation of the transistor switch occurs in the vicinity of the zero crossings of an AC voltage applied to the input of the rectifying bridge.

12. The circuit according to claim 1, further comprising an inrush current limiting resistor, and wherein actuation of the first thyristor bypasses the inrush current limiting resistor.

13. The circuit according to claim 1, wherein the rectifying bridge further has a second thyristor coupled in series with a second rectifying element between said first and second rectified output terminals, and wherein said cathode of the first diode is coupled to a gate of the second thyristor.

14. The circuit according to claim 13, further comprising a second resistor that directly connects the cathode of said first diode to the gate of said second thyristor.

15. The circuit according to claim 1, further comprising an AC capacitor coupled between input terminals of the rectifying bridge.

16. The circuit according to claim 15, further comprising:
   a transistor switch coupled between said first and second output terminals; and
   a discharge circuit configured to discharge the AC capacitor via at least the switch is turned on when a disconnection of the AC voltage is detected.

17. The circuit according to claim 1, further comprising a power conversion circuit coupled to said first and second output terminals.

* * * * *